United States Patent [19]

Hwang

[11] Patent Number: 5,625,305

[45] Date of Patent: Apr. 29, 1997

[54] LOAD DETECTION APPARATUS

[75] Inventor: Ching-Tung Hwang, Lungtan, Taiwan

[73] Assignee: Acer Incorporated, Taipei, Taiwan

[21] Appl. No.: 325,972

[22] Filed: Oct. 20, 1994

[51] Int. Cl.$^6$ ................................................ H03K 5/153
[52] U.S. Cl. ............................ 327/78; 327/77; 327/538; 327/535
[58] Field of Search ........................... 327/77, 78, 306, 327/316, 323, 324, 331, 332, 535, 538, 540, 542, 543, 545, 546

[56] References Cited

U.S. PATENT DOCUMENTS

| | | | |
|---|---|---|---|
| 4,916,332 | 4/1990 | Gontowski | 327/538 |
| 5,249,155 | 9/1993 | Arimoto et al. | 327/542 |
| 5,321,653 | 6/1994 | Suh et al. | 327/77 |
| 5,352,935 | 10/1994 | Yamamura et al. | 327/546 |
| 5,357,149 | 10/1994 | Kimura | 327/543 |
| 5,408,141 | 4/1995 | Devore et al. | 327/545 |
| 5,444,412 | 8/1995 | Kowalski | 327/543 |
| 5,448,199 | 9/1995 | Park | 327/546 |
| 5,491,445 | 2/1996 | Moller et al. | 327/540 |

*Primary Examiner*—Timothy P. Callahan
*Assistant Examiner*—Jung Ho Kim
*Attorney, Agent, or Firm*—Townsend and Townsend and Crew

[57] ABSTRACT

A load detection apparatus which can be used for detecting loads of various kinds of peripheral devices. The present apparatus utilizes a compared result of a load potential and a reference potential to generate a high/low level signal output to adjust the load potential and make the load potential thus have a small fluctuation to achieve the purpose of load detection and maintain the peripheral devices working normally and uninterruptedly. The present apparatus can be used for detecting loads of various kinds of peripheral devices by properly choosing and replacing the values of the reference potential and other circuit element quantities.

28 Claims, 5 Drawing Sheets

LOAD DETECTION APPARATUS

BACKGROUND OF THE INVENTION

The present invention is related to a detection apparatus, and more particularly to a load detection apparatus.

Nowadays, the presence of peripheral devices in a computer system is subject to an automatic load detection for automatically adapting the system configuration in order that the user can freely install various kinds of peripheral devices.

FIG. 1 is a schematic circuit diagram showing a conventional load detection apparatus electrically connected to a peripheral device 11. The conventional load detection apparatus includes a potential comparing device 12 and a load-connecting medium 13, wherein the potential comparing device 12 further includes a constant resistor 121 serially connected to a power source $V_{cc}$, a first voltage-dividing resistor 123, a second voltage-dividing resistor 124, and an operational amplifier 122. The conventional detection principle is described below.

If there is no peripheral device load electrically connected to the load-connecting medium 13, the potential measured at a point X will be $V_{cc}$ owing to the open circuit state of the load-connecting terminal 13. As for the potential measured at a point Y, it is obtained by dividing the voltage from $V_{cc}$ through the first and the second voltage-dividing resistors 123 and 124. A low level signal generated at a terminal Z to represent a loadless state is obtained by applying the potentials measured at the points X and Y to the operational amplifier 122.

However, when the peripheral device load 11 is electrically connected to the load-connecting terminal 13, a load current $I_L$ flows through the constant resistor 121 and the peripheral device load 11, and the voltage at the point X is then divided through the constant resistor 121 and the peripheral device load 11. Therefore, the potential measured at the point X will be lower than that measured at the point Y and thus the operational amplifier 122 will generate a high level signal at the terminal Z to represent the presence of a load.

The conventional technique for load detection has the shortcoming that it requires the resistance of the constant resistor 121 to have a constant value within a certain range. If the resistance is too small, a load-present signal will not be generated at the point Y when the load-connecting medium 13 is electrically connected to a peripheral device having a small load. On the other hand, if the resistance is too large, a large voltage drop will be generated when the load current $I_L$ flows through the constant resistor 121 so that the output voltage provided for the peripheral device through the load-connecting terminal 13 will be insufficient to drive the peripheral device when the load-connecting terminal 13 is electrically connected to a peripheral device having a heavy load.

For example, if the peripheral device 11 can be detected to be present when the voltage drop $V_{ax}$ across the constant resistance 121 is 0.1 V and the load current $I_L$ is 1 A, the constant resistor 121 should be designed to have a resistance of 100 mΩ. When the load-connecting terminal 13 is electrically connected to a peripheral device having such a small load that the load current $I_L$ intensity drops to 1 mA, $V_{ax}$ will be reduced to 0.1 mV and the potential at the point X is still higher than that at the point Y so that the load-present signal still cannot be generated at the terminal Z. Alternatively, if the load current intensity is 1 mA, then the constant resistor 121 should be designed to have a resistance of 100 Ω. When the load-connecting medium 13 is electrically connected to a peripheral device having such a heavy load that the load current $I_L$ intensity rises to 50 mA, the voltage drop $V_{ax}$ will rise to the power source voltage $V_{cc}$ so that the load-connecting terminal 13 cannot supply a sufficient voltage to drive the peripheral device.

To sum up, the conventional load detection technique cannot be widely used for detecting various kinds of load devices, because a correct signal indicative of the presence of a peripheral device cannot be obtained once the peripheral device load falls out of a certain range.

SUMMARY OF THE INVENTION

The present invention provides a load detection apparatus which can detect whether peripheral devices are present. The apparatus is suitable for use with a wide variety of peripheral devices.

In accordance with the present invention, a load detection apparatus includes a load-connecting terminal for electrically connecting to a load device, a load-potential adjusting device electrically connected to the load-connecting terminal for adjusting a potential for the load device in response to a potential adjusting signal, and a load sensor electrically connected to the load-connecting terminal and the load-potential adjusting circuit. The load sensor generates a load-present signal and the potential adjusting signal in response to a potential change generated from the load-connecting terminal when the load-connecting terminal is electrically connected to the load device.

In specific embodiments, the load-potential adjusting device further includes an electronic switch, which includes a transistor, e.g., a P-channel MOSFET, used for controlling a magnitude of a current flowing therethrough to adjust the potential, and the load sensor further includes a potential comparing device electrically connected to the load-connecting terminal for comparing the potential with a reference potential to output a compared result. The potential comparing device outputs a high level signal when the potential is smaller than the reference potential but outputs a low level signal when the potential is larger than the reference potential. The potential comparing device may be a voltage comparator which can include an operational amplifier. The potential is a voltage measured at the load-connecting terminal and the reference potential is a fixed voltage.

The load sensor further includes a potential adjusting signal generator, e.g., a driving circuit preferably including a bipolar junction transistor (BJT), electrically connected to the potential comparing device and the load-potential adjusting device to generate the potential adjusting signal according to the compared result for controlling the load potential adjusting device, and a load-present signal output device electrically connected to the potential comparing device for outputting the load present signal when the potential change is detected to be existent. The output device includes a clipper circuit converting an inputted square-wave signal into a clipper signal to be outputted as the load present signal.

In accordance with another aspect of the present invention, a load detection apparatus includes a load-connecting terminal for electrically connecting thereto a load device, a potential comparing device electrically connected to the load-connecting terminal for comparing a potential provided for the load device with a reference potential to obtain a compared result, and a load-potential adjusting device electrically connected to the load-connecting terminal and the potential comparing device for adjusting the potential according to the comparing result, and outputting a load present signal. The potential comparing device outputs a high level signal when the potential is smaller than the reference potential but outputs a low level signal when the potential is larger than the reference potential, wherein the potential is a voltage measured at the load-connecting terminal.

The load-potential adjusting device includes an electronic switch used for controlling a magnitude of a current flowing therethrough to adjust the potential, a potential adjusting signal generator, e.g., a driving circuit, electrically connected to the potential comparing device and the load-potential adjusting device to adjust the load potential according to the compared result, and a load-present signal output device electrically connected to the potential comparing device and outputting the load present signal according to the compared result. The output device includes a clipper circuit converting an inputted square-wave signal into a clipper signal to be outputted as the load present signal.

In accordance with another aspect of the present invention, a load detection apparatus includes a load-connecting terminal for electrically connecting thereto a load device, a load-potential signal processing device electrically connected to the load-connecting terminal, generating an output signal in response to a potential provided for the load device when the load device is electrically connected to the load-connecting terminal, and having an input terminal for receiving therefrom a controlling signal for adjusting the potential, and a controlling signal generator electrically connected to the load-potential signal processing device, triggered by the output signal to generate the controlling signal to be sent to the input terminal, and outputting a load present signal. The load-potential signal processing device includes a potential comparing device electrically connected to the load-connecting terminal for comparing the potential with a reference potential, and outputting a high level signal when the potential is smaller than the reference potential but outputting a low level signal when the potential is larger than the reference potential. The potential is a voltage measured at the load-connecting terminal.

The load-potential signal processing device further includes a load-potential adjusting device electrically connected to the potential comparing device and the load-connecting terminal for adjusting the potential according to the controlling signal, and including an electronic switch used for controlling a magnitude of a current flowing therethrough to adjust the potential. The controlling signal generator, e.g., a driving circuit, further includes a potential adjusting signal generator electrically connected to the load-potential signal processing device for generating the controlling signal to be sent to the input terminal in response to the output signal for controlling the load-potential signal processing device, and a load-present signal output device electrically connected to the load-potential signal processing device for generating the load present signal in response to the output signal. The output device includes a clipper circuit converting an inputted square-wave signal into a clipper signal to be outputted as the load present signal.

The present invention may be best understood through the following description with reference to the accompanying drawings, in which:

DESCRIPTION OF SPECIFIC EMBODIMENTS

The present invention will now be described more specifically with reference to the following embodiments. It is to be noted that the following descriptions of preferred embodiments of this invention are presented for purpose of illustration and description only; it is not intended to be exhaustive or to be limited to the precise form disclosed.

Figure 1:
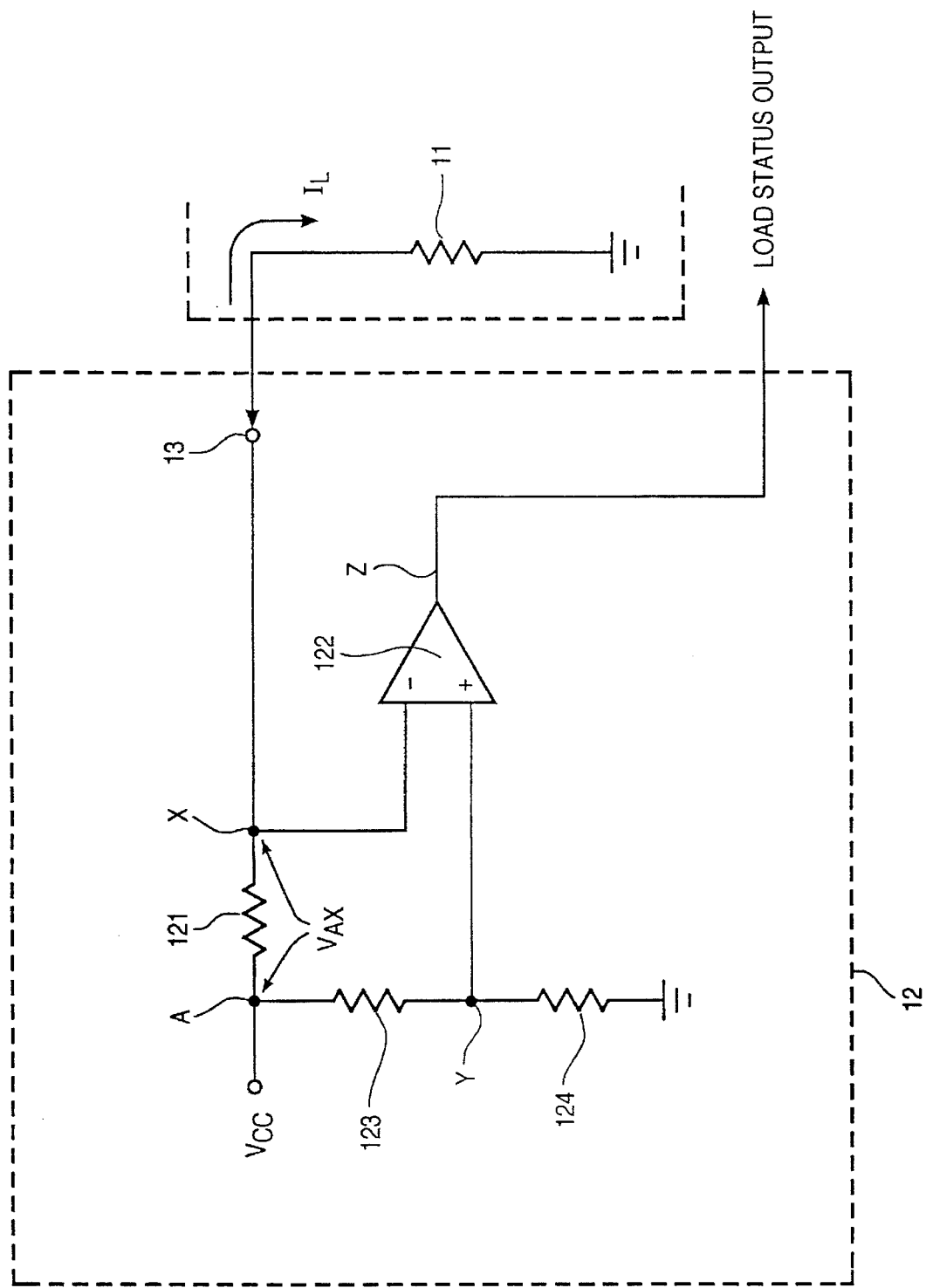
FIG. 1 is a schematic circuit diagram showing a conventional load detection apparatus electrically connected to a peripheral device.
Figure 2:
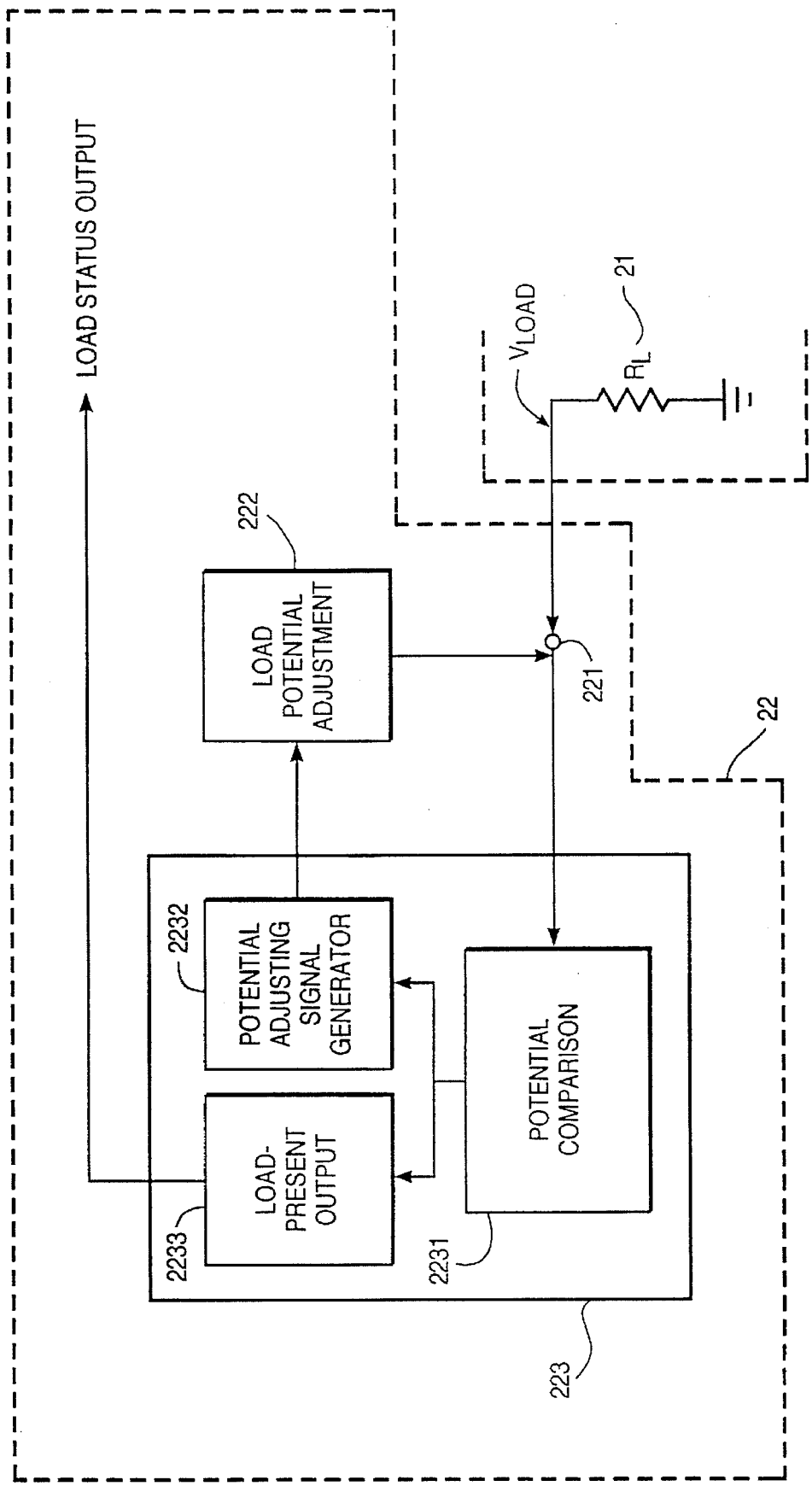
FIG. 2 is a schematic block diagram showing a first embodiment of a load detection apparatus electrically connected to a load device according to the present invention.

FIG. 2 is a schematic block diagram showing a first embodiment of a load detection apparatus electrically connected to a load device. FIG. 2 shows a load device 21 and a load detection apparatus 22, which includes a load-connecting terminal 221, a load-potential adjusting device 222, and a load sensor 223. The load sensor 223 further includes a potential comparing device 2231, a potential adjusting signal generator 2232, and a load-present signal output device 2233.

Figure 3:
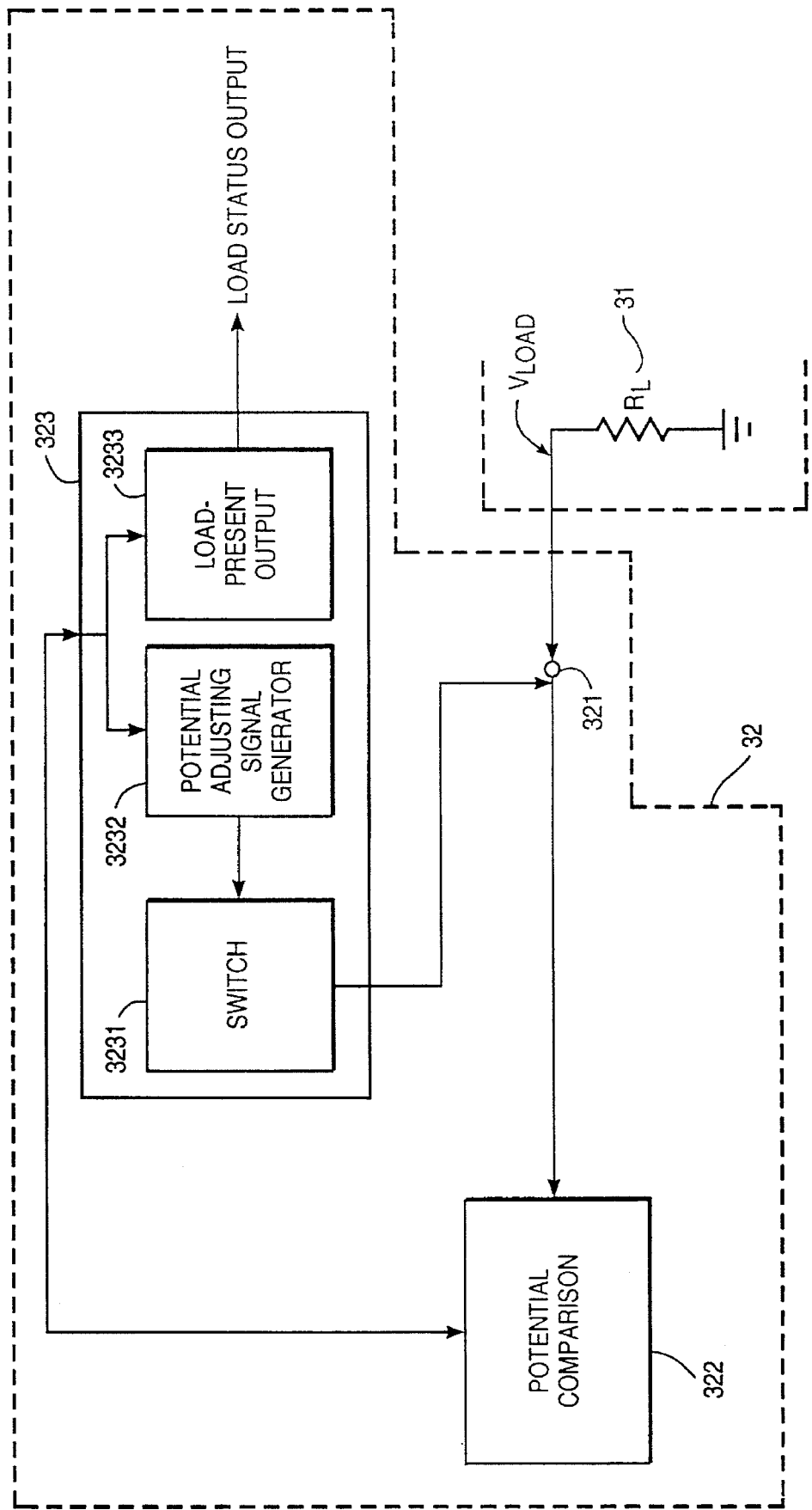
FIG. 3 is a schematic block diagram showing a second embodiment of a load detection apparatus electrically connected to a load device according to the present invention.

FIG. 3 is a schematic block diagram showing a second embodiment of a load detection apparatus electrically connected to a load device. FIG. 3 shows a load device 31 and a load detection apparatus 32, which includes a load-connecting terminal 321, a potential comparing device 322, and a load-potential adjusting device 323. The load-potential adjusting device 323 further includes an electronic switch 3231, a potential adjusting signal generator 3232, and a load-present signal output device 3233.

Figure 4:
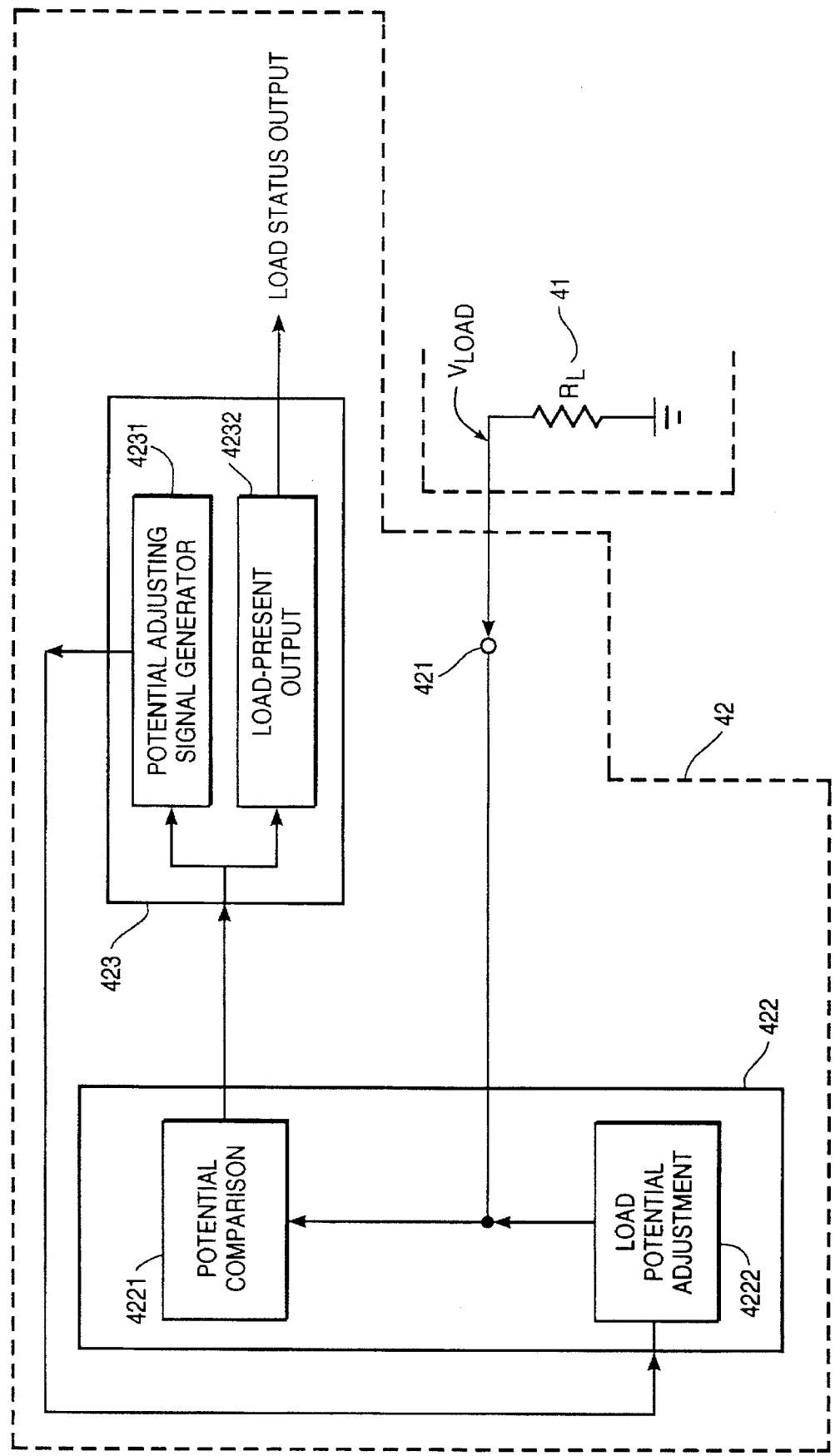
FIG. 4 is a schematic block diagram showing a third embodiment of a load detection apparatus electrically connected to a load device according to the present invention.

FIG. 4 is a schematic block diagram showing a third embodiment of a load detection apparatus electrically connected to a load device. FIG. 4 shows a load device 41 and a load detection apparatus 42, which includes a load-connecting terminal 421, a load-potential signal processing device 422, and a controlling signal generator 423 are presented. The load-potential signal processing device 422 further includes a potential comparing device 4221 and a load-potential adjusting device 4222. The controlling signal generator 423 further includes a potential adjusting signal generator 4231, i.e. a driving circuit, and a load-present signal output device 4232.

Figure 5:
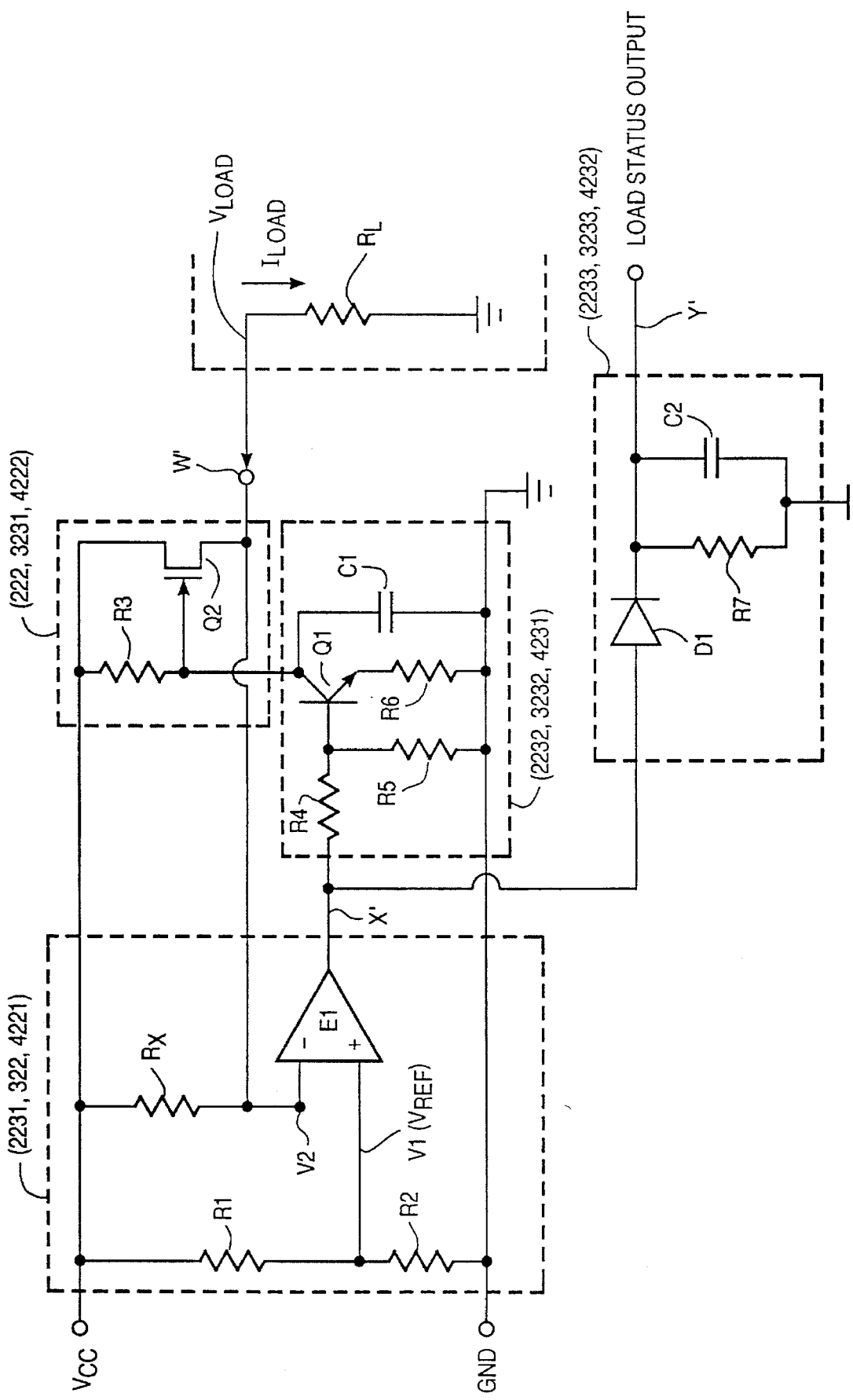
FIG. 5 is a schematic circuit diagram showing a preferred embodiment of a load detection apparatus according to the present invention.

FIG. 5 is a schematic circuit diagram showing a preferred embodiment of a load detection apparatus according to the present invention. The present working circuit includes resistors R1–R7 and Rx, capacitors C1 and C2, a 741-type operational amplifier E1, a diode D1, a BJT Q1 and a P-channel MOSFET Q2. A load resistor $R_L$ representing the load device is also shown.

The load-potential adjusting device 222 in FIG. 2, the electronic switch 3231 in FIG. 3, and the load-potential adjusting device 4222 in FIG. 4 all include a resistor and a MOSFET such as R3 and Q2, respectively, in FIG. 5.

The potential comparing device 2231 in FIG. 2, the potential comparing device 322 in FIG. 3, and the potential comparing device 4221 in FIG. 4 all include three resistors and an operational amplifier such as R1, R2, Rx, and E1, respectively, in FIG. 5.

The potential adjusting signal generator 2232 in FIG. 2, the potential adjusting signal generator 3232 in FIG. 3, and the potential adjusting signal generator 4231 in FIG. 4 all include three resistors, a BJT, and a capacitor such as R4, R5, R6, Q1, and C1, respectively, in FIG. 5.

The load-present signal output device 2233 in FIG. 2, the load-present signal output device 3233 in FIG. 3, and the load-present signal output device 4232 in FIG. 4 all include a diode, a resistor, and a capacitor such as D1, R7, and C2, respectively, in FIG. 5.

The working principle of the circuit shown in FIG. 5 is described below in detail.

Resistors R1 and R2 are both voltage-dividing resistors, so a fixed reference potential $V_{ref}$ (a fraction of $V_{cc}$) is generated at a point V1. If there is no load device electrically connected to the load-connecting terminal W', the potential at a point V2 will be equal to $V_{cc}$ and the operational amplifier will generate a low level signal at its output terminal X', representing a loadless state. A low level at the output terminal X' results in a low level at the load status output terminal Y'.

If there is a load device electrically connected to the load-connecting terminal W', a reduced voltage $V_{Load}$ will be detected at the point V2 when the load current $I_{Load}$ flows through the resistor Rx. The two input terminal potentials $V_{ref}$ and $V_{Load}$ of the operational amplifier E1 are compared to obtain the compared result of $V_{Load} < V_{ref}$ so that a high level signal will be generated at the terminal X'. Therefore, the BJT Q1 is switched on and causes the MOSFET Q2 to switch on to have $V_{Load}$ raised. When $V_{Load}$ rises to a value greater than $V_{ref}$, the low level signal is again generated at the terminal X' to turn Q1 and Q2 off and thus have the $V_{Load}$ decreased until the high level signal is again generated. By repeatedly alternatively generating the low level and the high level signals and adjusting the $V_{Load}$ values at the point V2, a square-wave signal is successively generated at the terminal X'. The square-wave signal is clipped through the diode D1 and outputted to serve as a load-present signal at the terminal Y'.

Because the resistor R3 and the MOSFET Q2 are used for adjusting a load potential, the present invention can detect the presence of any one of various kinds of peripheral loads. On the other hand, the resistor R3 serves as a biasing resistor of the MOSFET Q2; the resistors R4, R5, and R6 serve as biasing resistors of the BJT Q1; the resistor R7 and the capacitor C2 integrate the square-wave signal; and the function of the capacitor C1 is merely to delay the BJT Q1 from being off so that the capacitance of C1 can be arbitrary.

Any potential provided for a peripheral device is allowed to fluctuate within a small range. Therefore, the present invention utilizes the small fluctuation of the potential at the point V2 to achieve the purpose of load detection and assures that the peripheral devices can work normally and uninterruptedly.

The theory of the circuit shown in FIG. 5 is as follows.

Potential at the point $V1 = V_{ref} = V_{cc} \times R2/(R1+R2)$

Potential at the point $V2 = V_{Load} = V_{cc} \times R_L/(Rx+R_L)$

When $V_{Load} < V_{ref}$ then $R_L/(Rx+R_L) < R2/(R1+R2)$ $(Rx+RL)/R_L > (R1+R2)/R2$ $Rx/R_L > R1/R2$ (1)

In order for the peripheral device to work normally, the potential provided for the peripheral device, i.e. the potential at the point V2, must be maintained within a tolerable fluctuation range. For example, assume that $V_{Load}$ should be at least 95% of $V_{cc}$:

$V_{cc} \geq V_{Load} = V_{ref} \geq 0.95 * V_{cc}$

If R1/R2=1/50, then the potential at the terminal V1=0.98*$V_{cc}$. Substituting the above equation into (1) leads to:

$R_L < (R2/R1)*Rx < 50Rx$ $I_{Load}*R_L = V_{Load} = V_{ref}$ $I_{Load} = V_{ref}/R_L > V_{ref}/50Rx$ (2)

From the above relationship, it can be seen that the presence of any one of various kinds of peripheral loads can be correctly detected by properly choosing the values of Vref and Rx. For example, if Rx=1 KΩ, $V_{cc}$=5 V, and $V_{ref}$= 0.98*$V_{cc}$=4.9 V, then $I_{Load}$>0.098 mA. That is, the present apparatus can be used to detect any peripheral load whose current exceeds 0.098 mA and keep the peripheral device working normally.

Preferred values for the elements of the circuit shown in FIG. 5 are as follows:

Rx=1 KΩ, R1=100 Ω, R2=5 KΩ, R3=2.2 KΩ, R4=5 KΩ, R5=2.2 KΩ, R6=1 KΩ, R7=10 KΩ, C1=100 pf, C2=0.1 µf

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A load detection apparatus comprising:

a load-connecting terminal for electrically connecting to a load device;

an output terminal for outputting a load present signal, said load present signal indicating that said load-connecting terminal is electrically connected to said load device;

a load-potential adjusting device electrically connected to said load-connecting terminal for adjusting a potential for said load device in response to a potential adjusting signal; and a load sensor electrically connected to said load-connecting terminal and said load-potential adjusting device for generating the load-present signal at said output terminal and said potential adjusting signal in response to a potential change generated from said load-connecting terminal when said load-connecting terminal is electrically connected to said load device, wherein said load sensor comprises:

a potential comparing device electrically connected to said load-connecting terminal for comparing said potential with a reference potential to output a compared result;

a potential adjusting signal generator electrically connected to said potential comparing device and said load-potential adjusting device to generate said potential adjusting signal according to said compared result for controlling said load potential adjusting device; and a load-present signal output device electrically connected to said potential comparing device for outputting said load present signal when said potential change is detected to be present, wherein said output device includes a clipper circuit converting an inputted square-wave signal into a clipper signal to be outputted as said load present signal.

2. The load detection apparatus of claim 1 wherein said load-potential adjusting device includes an electronic switch used for controlling a magnitude of a current flowing therethrough to adjust said potential.

3. The load detection apparatus of claim 2 wherein said electronic switch includes a transistor.

4. The load detection apparatus of claim 3 wherein said transistor is a MOSFET.

5. The load detection apparatus of claim 4 wherein said MOSFET is a P-channel device.

6. The load detection apparatus of claim 1 wherein said potential comparing device outputs a high level signal when said potential is smaller than said reference potential but outputs a low level signal when said potential is larger than said reference potential.

7. A load detection apparatus of claim 1 wherein said potential comparing device is a voltage comparator.

8. The load detection apparatus of claim 7 wherein said voltage comparator includes an operational amplifier.

9. The load detection apparatus of claim 8 wherein said operational amplifier is a type-741 device.

10. The load detection apparatus of claim 7 wherein said potential is a voltage measured at said load-connecting terminal.

11. The load detection apparatus of claim 7 wherein said reference potential is a fixed voltage.

12. The load detection apparatus of claim 1 wherein said potential adjusting signal generator is a driving circuit.

13. The load detection apparatus of claim 12 wherein said driving circuit includes a transistor.

14. The load detection apparatus of claim 13 wherein said transistor is a BJT.

15. A load detection apparatus, comprising:

a load-connecting terminal for electrically connecting thereto a load device;

an output terminal for outputting a load present signal, said load present signal indicating that said load-connecting terminal is electrically connected to said load device;

a potential comparing device electrically connected to said load-connecting terminal and comparing a potential provided for said load device with a reference potential to obtain a compared result; and a load-potential adjusting device electrically connected to said load-connecting terminal and said potential comparing device for adjusting said potential provided for said load device according to said compared result, and generating the load present signal at said output terminal when said load-connecting terminal is electrically connected to said load device, wherein said load-potential adjusting device comprises:

a load-present signal output device electrically connected to said potential comparing device and outputting said load present signal according to said compared result, wherein said output device comprises:

a clipper circuit converting an inputted square-wave signal into a clipper signal to be outputted as said load present signal.

16. The load detection apparatus of claim 15 wherein said potential comparing device outputs a high level signal when said potential is smaller than said reference potential but outputs a low level signal when said potential is larger than said reference potential.

17. The load detection apparatus of claim 15 wherein said potential is a voltage measured at said load-connecting terminal.

18. The load detection apparatus of claim 15 wherein said load-potential adjusting device includes an electronic switch used for controlling a magnitude of a current flowing therethrough to adjust said potential.

19. The load detection apparatus of claim 18 wherein said load-potential adjusting device further comprises a potential adjusting signal generator electrically connected to said potential comparing device and said switch to supply a potential adjusting signal to said switch according to said compared result, said potential adjusting signal controlling the magnitude of the current flowing through the switch.

20. The load detection apparatus of claim 19 wherein said potential adjusting signal generator is a driving circuit.

21. The load detection apparatus, comprising:

a load-connecting terminal for electrically connecting thereto a load device;

an output terminal for outputting a load present signal, said load present signal indicating that said load-connecting terminal is electrically connected to said load device;

a load-potential signal processing device electrically connected to said load-connecting terminal, generating an output signal in response to a potential provided for said load device when said load device is electrically connected to said load-connecting terminal, and having an input terminal for receiving therefrom a controlling signal for adjusting said potential; and a controlling signal generator electrically connected to said load-potential signal processing device, triggered by said output signal to generate said controlling signal to be sent to said input terminal, and outputting the load present signal at said output terminal when said load device is electrically connected to said load-connecting terminal, wherein said controlling signal generator comprises:

a load-present signal output device electrically connected to said load-potential signal processing device for generating said load present signal in response to said output signal, wherein said output device comprises:

a clipper circuit converting an inputted square-wave signal into a clipper signal to be outputted as said load present signal.

22. The load detection apparatus of claim 21 wherein said load-potential signal processing device includes a potential comparing device electrically connected to said load-connecting terminal for comparing said potential with a reference potential.

23. The load detection apparatus of claim 22 wherein said potential comparing device outputs a high level signal when said potential is smaller than said reference potential but outputs a low level signal when said potential is larger than said reference potential.

24. The load detection apparatus of claim 21 wherein said potential is a voltage measured at said load-connecting terminal.

25. The load detection apparatus of claim 21 wherein said load-potential signal processing device further comprises a load-potential adjusting device electrically connected to said potential comparing device and said load-connecting terminal for adjusting said potential according to said controlling signal.

26. The load detection apparatus of claim 25 wherein said load-potential adjusting device includes an electronic switch used for controlling a magnitude of a current flowing therethrough to adjust said potential.

27. The load detection apparatus of claim 25 wherein said controlling signal generator further comprises a potential adjusting signal generator electrically connected to said load-potential signal processing device for generating said controlling signal to be sent to said input terminal in response to said output signal for controlling said load-potential signal processing device.

28. The load detection apparatus of claim 27 wherein said potential adjusting signal generator is a driving circuit.

* * * * *